(12) United States Patent
Chuang et al.

(10) Patent No.: US 12,666,581 B2
(45) Date of Patent: Jun. 23, 2026

(54) POWER SUPPLY DEVICE

(71) Applicant: DELTA ELECTRONICS, INC.,
Taoyuan City (TW)

(72) Inventors: Chien-Feng Chuang, Taoyuan City
(TW); Chung-Yi Chen, Taoyuan City
(TW)

(73) Assignee: DELTA ELECTRONICS, INC.,
Taoyuan City (TW)

( * ) Notice: Subject to any disclaimer, the term of this
patent is extended or adjusted under 35
U.S.C. 154(b) by 266 days.

(21) Appl. No.: 18/669,538

(22) Filed: May 21, 2024

(65) Prior Publication Data

US 2024/0414896 A1 Dec. 12, 2024

(30) Foreign Application Priority Data

| Jun. 6, 2023 | (CN) | .......................... | 202310660362.2 |
| Mar. 13, 2024 | (CN) | .......................... | 202410286610.6 |

(51) Int. Cl.
H05K 7/20 (2006.01)

(52) U.S. Cl.
CPC ................................ H05K 7/20909 (2013.01)

(58) Field of Classification Search
CPC ........... H05K 7/20172; H05K 7/20581; H05K
7/20909; H05K 7/20; H05K 7/1487;
H05K 1/0203; H05K 1/118; H05K
2201/10106; H05K 5/006; H05K 5/0069;
H05K 5/0247; H05K 5/03; H05K 7/14;
H05K 7/1402;

(Continued)

(56) References Cited

U.S. PATENT DOCUMENTS

| 6,186,889 B1* | 2/2001 | Byrne | ................ | H05K 7/20172 |
| | | | | 361/695 |
| 7,515,413 B1* | 4/2009 | Curtis | ................ | H05K 7/20172 |
| | | | | 415/213.1 |

(Continued)

FOREIGN PATENT DOCUMENTS

| CN | 202603074 U | 12/2012 |
| CN | 212515613 U | 2/2021 |

(Continued)

OTHER PUBLICATIONS

Zeng et al. CN117460224, Fan Module, Jan. 26, 2024, PE2E
Translation (Year: 2024).*

(Continued)

*Primary Examiner* — Michael A Matey
(74) *Attorney, Agent, or Firm* — HDLS IPR SERVICES;
Chun-Ming Shih

(57) ABSTRACT

A power supply device includes a control board disposed
within the chassis. An input connector and an output con-
nector are disposed within the chassis and are electrically
connected to the control board. A fan module includes a fan
frame and a fan connector disposed on the outer surface of
the fan frame. A flexible printed circuit board includes a
conducting section, a fan connecting section and a lighting
connecting section. The conducting section is electrically
connected to the control board, fan connecting section and
the lighting connecting section. The fan connecting section
is electrically connected to the fan connector. The light-
guiding handle is coupled to the chassis and disposed on the
lighting connecting section to face the light-guiding handle.

6 Claims, 7 Drawing Sheets

(58) Field of Classification Search
CPC ...... H05K 7/1427; H05K 7/1492; G06F 1/20;
G06F 1/183; G06F 1/181; G06F 1/188;
G06F 1/26; G06F 1/3203; F04D 29/646;
F04D 25/166; F04D 19/002; F04D 29/58;
F04D 29/626; F21V 33/0096; F21Y
2115/10; G11B 33/142; G11B 33/02;
G11B 33/126; G02F 1/133603; G02F
1/133628; H01R 12/7088
See application file for complete search history.

(56) References Cited

U.S. PATENT DOCUMENTS

| | | | |
|---|---|---|---|
| 7,623,343 B2 * | 11/2009 | Chen | G06F 1/186 |
| | | | 361/679.4 |
| 8,300,404 B2 * | 10/2012 | Tan | H05K 7/20727 |
| | | | 361/679.48 |
| 9,253,927 B1 * | 2/2016 | Kull | H05K 7/14 |
| 9,326,420 B2 * | 4/2016 | Zhang | H05K 7/2039 |
| 10,178,806 B1 * | 1/2019 | Fricker | H05K 7/20581 |
| 10,285,306 B1 * | 5/2019 | Minkin | H05K 7/20909 |
| 10,660,234 B2 * | 5/2020 | Chen | F04D 29/522 |
| 2005/0030711 A1 * | 2/2005 | Tsai | G06F 1/20 |
| | | | 361/679.48 |
| 2005/0105271 A1 * | 5/2005 | Lu | H05K 7/20172 |
| | | | 415/213.1 |
| 2008/0239665 A1 * | 10/2008 | Franz | F04D 29/664 |
| | | | 417/423.15 |
| 2009/0168400 A1 * | 7/2009 | Liu | F21V 33/0096 |
| | | | 362/96 |
| 2013/0202429 A1 | 8/2013 | Kuo et al. | |
| 2018/0070473 A1 * | 3/2018 | Zhang | G06F 1/181 |
| 2018/0100512 A1 | 4/2018 | Chen et al. | |
| 2019/0182982 A1 * | 6/2019 | Gopalakrishna | H05K 7/20172 |
| 2019/0200481 A1 * | 6/2019 | Avvaru | G11B 33/142 |
| 2019/0317577 A1 | 10/2019 | Lin et al. | |
| 2020/0303883 A1 | 9/2020 | Li et al. | |
| 2020/0341188 A1 | 10/2020 | Diana et al. | |
| 2022/0354023 A1 * | 11/2022 | Fan | H05K 7/1492 |
| 2024/0324138 A1 * | 9/2024 | Chi | G06F 1/20 |

FOREIGN PATENT DOCUMENTS

| | | |
|---|---|---|
| EP | 331014 A1 | 4/2018 |
| TW | 201500650 A | 1/2015 |
| TW | M610148 U | 4/2021 |

OTHER PUBLICATIONS

Ho et al. M610148, Power Supply, Apr. 11, 2021, PE2E Translation (Year: 2021).*

Search Report dated Jul. 9, 2024 of the corresponding European patent application No. 24178270.5.

Office Action dated Oct. 15, 2024 of the corresponding Taiwan patent application No. 113109158.

Office Action dated Feb. 23, 2024 of the relating Taiwan patent application No. 112120977.

Search Report dated Mar. 13, 2024 of the relating European patent application No. 23202242.6.

* cited by examiner

POWER SUPPLY DEVICE

BACKGROUND OF THE DISCLOSURE

Technical Field

The technical field relates to a power supply device, and more particularly relates to a power supply device for easy assembly.

Description of Related Art

Fans are commonly employed in various electronic devices to facilitate cooling. For example, power supply devices often utilize fans to dissipate heat to ensure that the internal components of the power supply device operate within a suitable temperature range for normal functionality. A typical method of fan connection involves extending a wire directly from inside the fan and attaching a connector to its conductive end. This connector is then used to establish electrical connection with the control board of the power supply device to control the operation of fan and supply necessary power.

Additionally, because power supply devices have varying internal designs, fans need to be designed with wire lengths and exit positions corresponding to the location of the circuit board. Therefore, even fans of the same size may not be interchangeable among different power supply devices due to differences in wire length and exit position. For example, if the fan wire is too long or the exit location is not optimal, it may interfere with other electronic components and result in wiring and assembly difficulties. If the fan wire is too short, the fan may fail to establish electrical connection with the control board and may not function.

In view of the above drawbacks, the inventor proposes this disclosure based on his expert knowledge and elaborate researches in order to solve the problems of related art.

SUMMARY OF THE DISCLOSURE

This disclosure provides a power supply device for simplifying the connection structure of the fan modules and increasing the convenience of use.

This disclosure is a power supply device including a chassis, a control board, an input connector, an output connector, a fan module, a flexible printed circuit board and a light-guiding handle. The control board is disposed within the chassis. The input connector and the output connector are disposed within the chassis and electrically connected to the control board. The fan module is mounted within the chassis. The fan module includes a fan frame and a fan connector disposed on an outer surface of the fan frame. The flexible printed circuit board includes a conducting section, a fan connecting section and a lighting connecting section. One end of the conducting section is electrically connected to the control board, and another end of the conducting section is electrically connected to the fan connecting section and the lighting connecting section. The fan connecting section is electrically connected to the fan connector. The light-guiding handle is coupled to the chassis. The lighting component is disposed on the lighting connecting section and faces the light-guiding handle.

In one embodiment, a hollow slot is defined on the fan frame, and the fan connector is exposed from the hollow slot.

In one embodiment, the power supply device further includes a fan circuit board, wherein an insertion slot communicating with the hollow slot is defined on the fan frame, and the fan circuit board is inserted in the insertion slot.

In one embodiment, one end of the conducting section is pressed (sandwiched) between the control board and the chassis.

In one embodiment, the light-guiding handle and the lighting component are mounted on the fan frame.

In one embodiment, the fan module and the input connector are mounted on the front end of the chassis away from the output connector, and the fan connector is disposed between the fan frame and the input connector.

In comparison with the related art, the control board and fan module in this disclosure are installed within the chassis, and the fan connector is disposed on the outer surface of the fan frame of the fan module. Moreover, the fan module is electrically connected to the control board through one end of the connecting component inserting to the fan connector and another end of the connecting component inserting to the control board, thereby simplifying the connection structure between the electronic device and the fan. Additionally, the connecting component may include a flexible printed circuit board that may be pressed between the control board and the chassis to prevent interference with other electronic components within the chassis, thereby enhancing practicality and convenience of use.

BRIEF DESCRIPTION OF THE DRAWINGS

The features of the disclosure believed to be novel are set forth with particularity in the appended claims. The disclosure itself, however, may be best understood by reference to the following detailed description of the disclosure, which describes a number of exemplary embodiments of the disclosure, taken in conjunction with the accompanying drawings, in which:

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Figure 1:
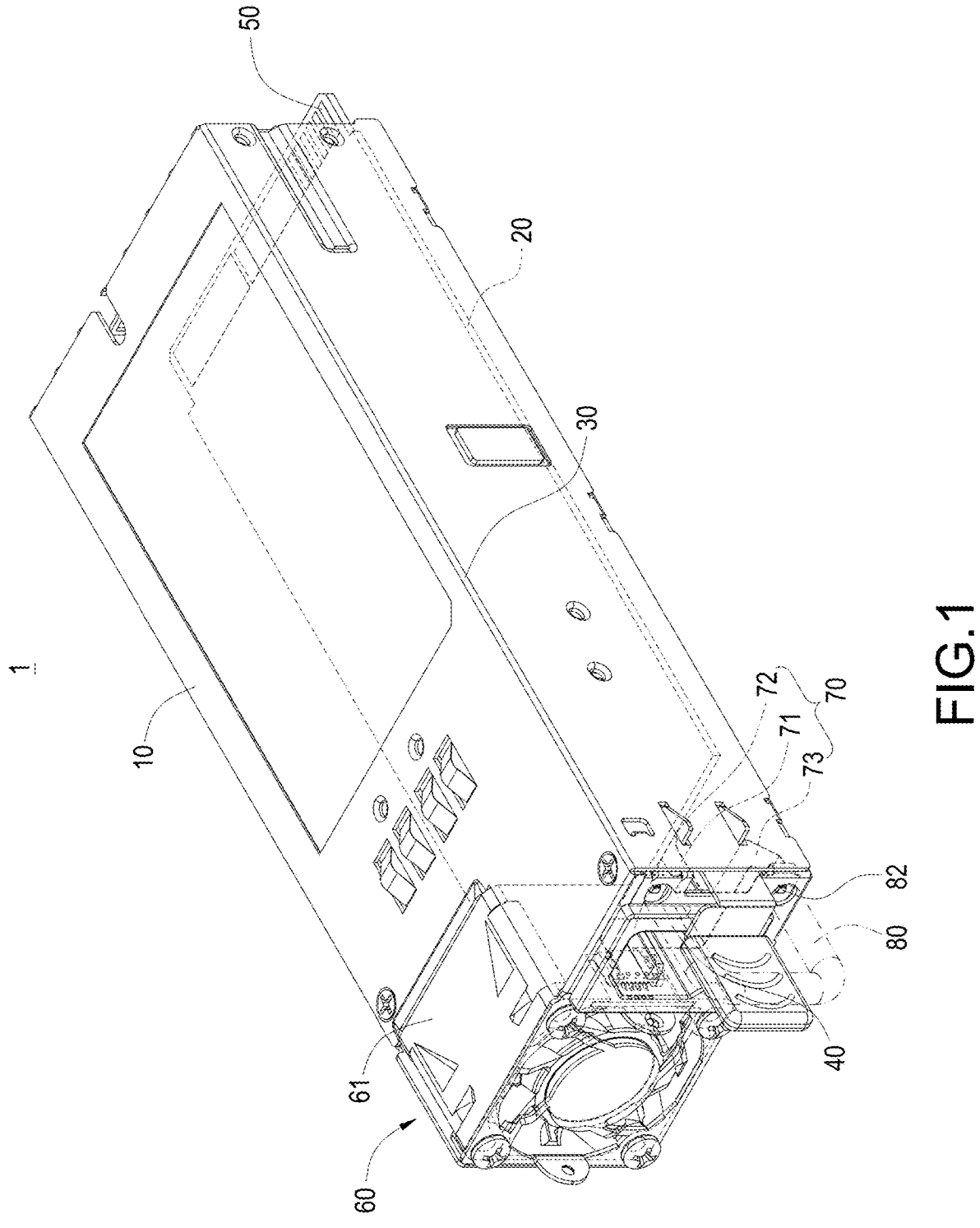
FIG. 1 and FIG. 2 illustrate perspective schematic views of the power supply device from two sides thereof in this disclosure.
Figure 2:
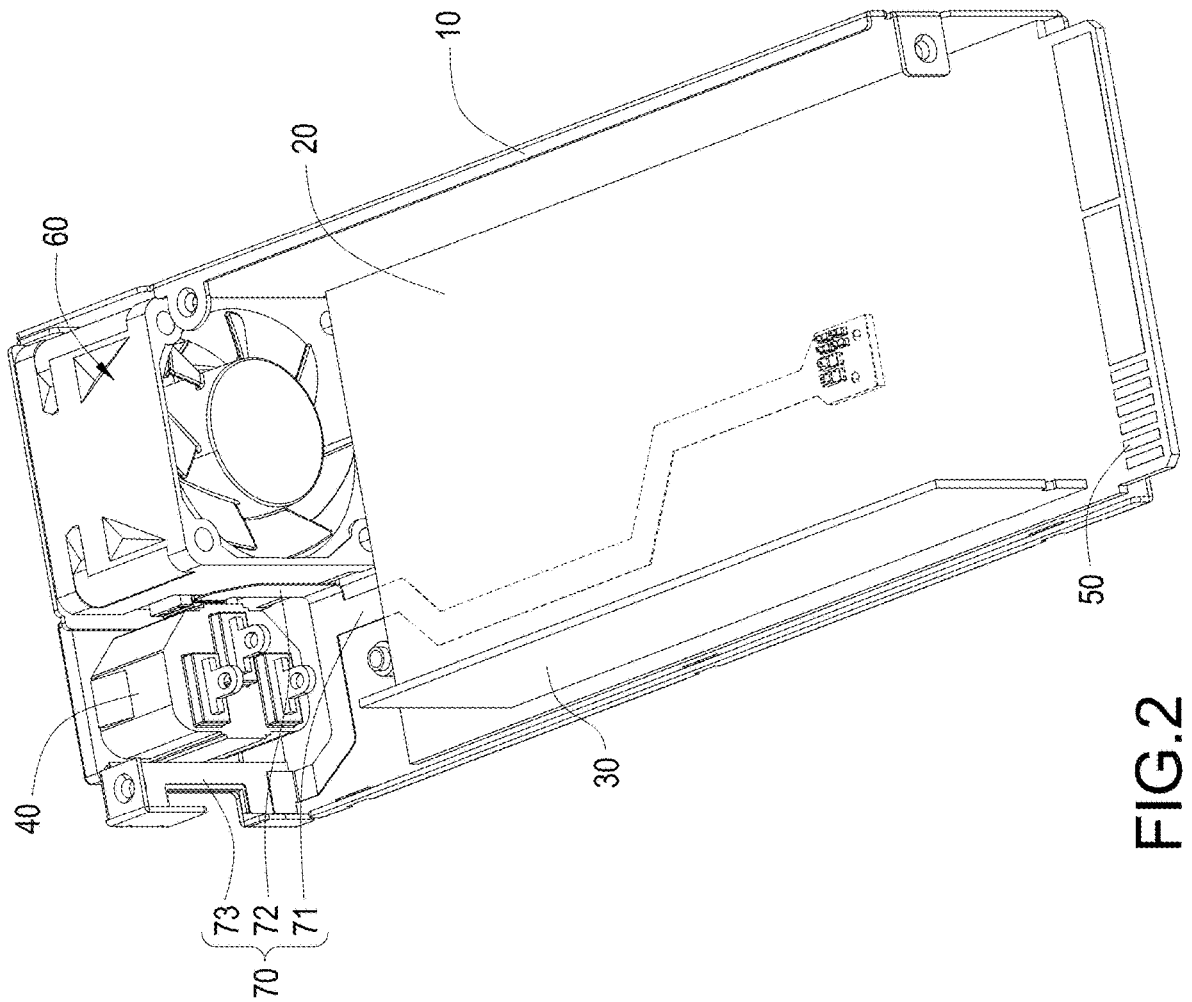

Please refer to FIG. 1 and FIG. 2, which depict perspective schematic views of the power supply device from two sides thereof in this disclosure. A power supply device 1 includes a chassis 10, a control board 20, an adapter board 30, an input connector 40, an output connector 50, a fan module 60, a connecting component 70 and a light-guiding handle 80. The control board 20 and the adapter board 30 are arranged in the chassis 10. The input connector 40 and the output connector 50 are disposed within the chassis 10. In this embodiment, the input connector 40 and the output connector 50 are respectively located on the front and rear sides of the chassis 10 and electrically connected to the control board 20. The fan module 60 is mounted within the chassis 10 and electrically connected to the control board 20 via the connecting component 70.

In this embodiment, both the control board 20 and adapter board 30 are equipped with appropriate circuit components to fulfill the required functions. In some embodiments, the adapter board 30 may be omitted. The adapter board 30 is positioned vertically and electrically connected to the control board 20. The control board 20 is positioned horizontally on the bottom surface of the chassis 10. The input connector 40 may be an IEC 60320 C14 or another suitable connector, while the output connector 50 may also adopt suitable specifications. For example, the power supply device 1 is connected to the power grid to receive electrical power through the input connector 40. After conversion to the appropriate voltage by the control board 20, the power is supplied to one or more external electronic devices via the output connector 50.

Figure 3:
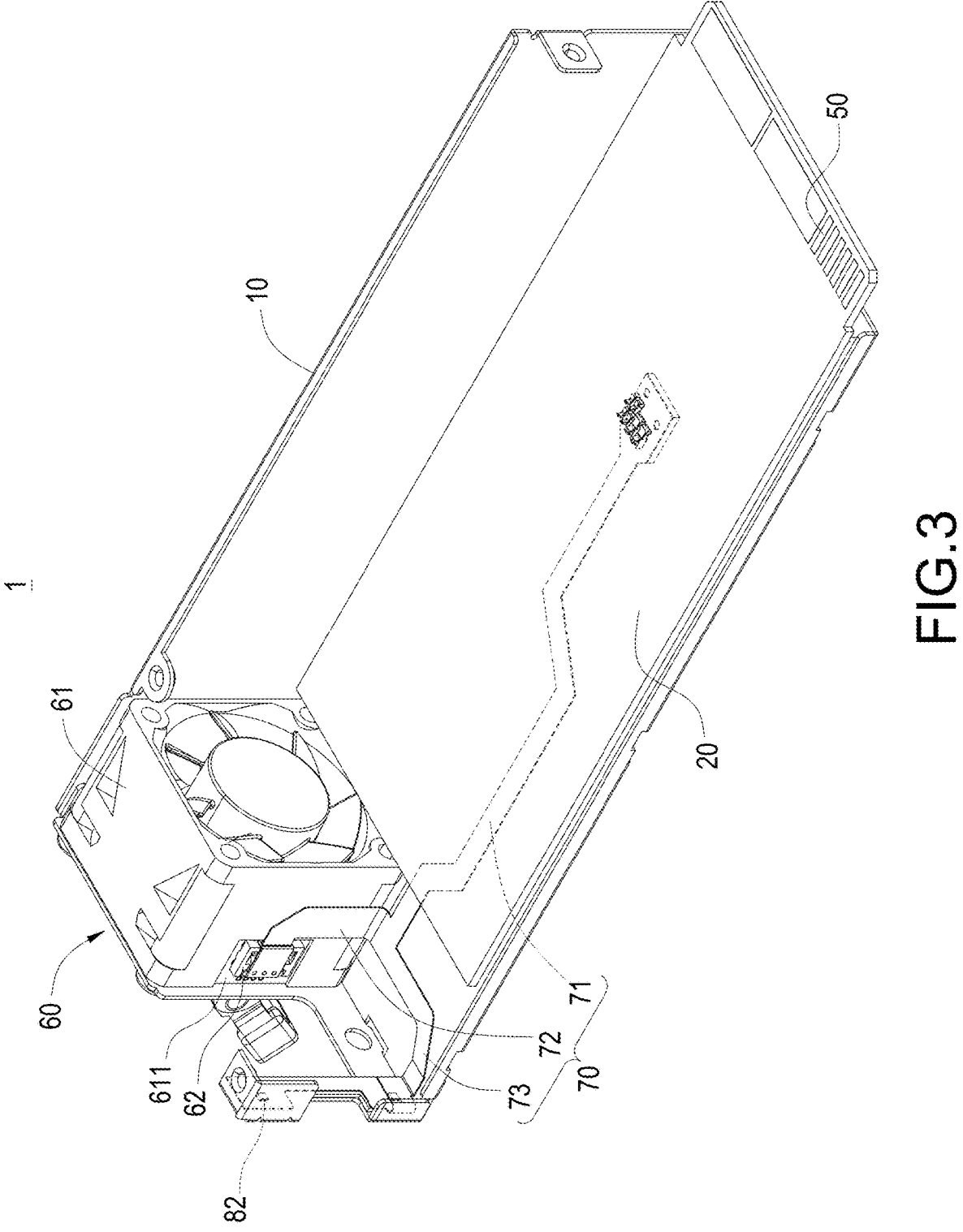
FIG. 3 illustrates a schematic view of the connection between the flexible printed circuit board and the fan module in this disclosure.
Figure 4:
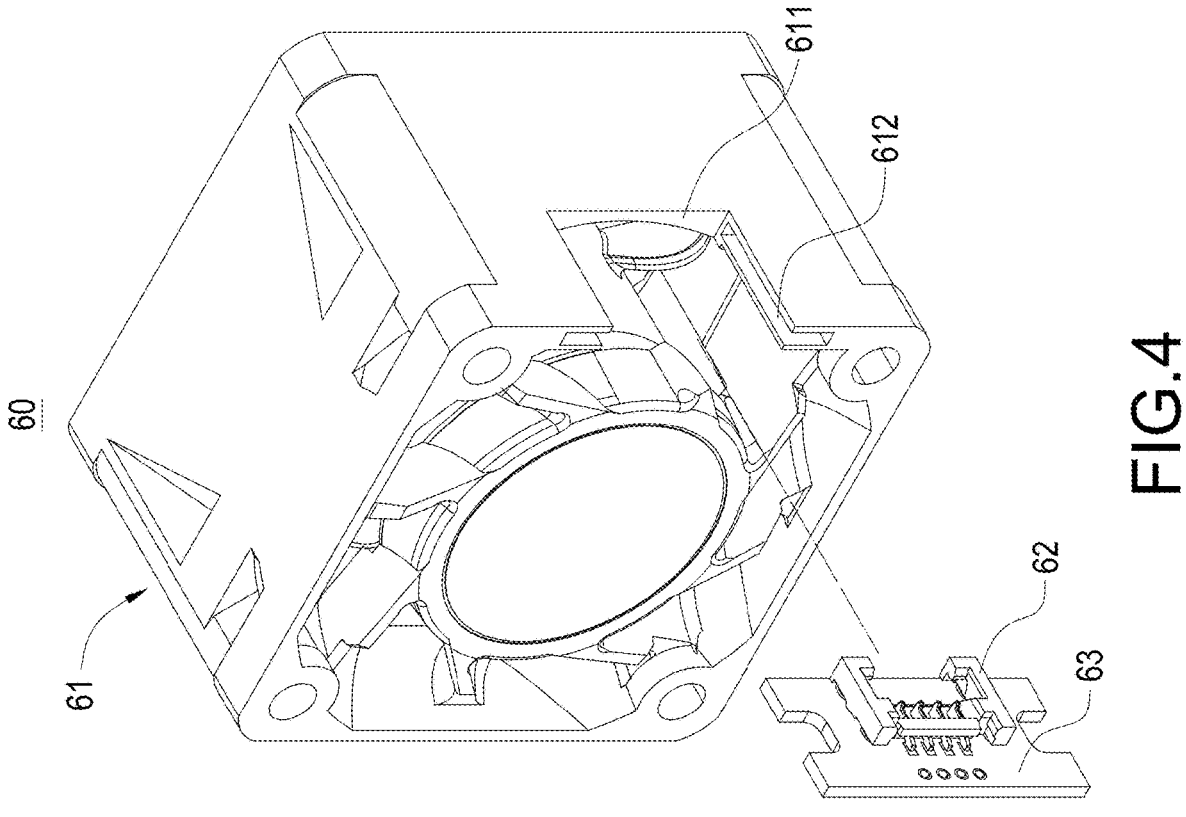
FIG. 4 illustrates a schematic view depicting the combination of the fan circuit board and the fan frame in this disclosure.

Please also refer to FIG. 3 and FIG. 4, which illustrate a schematic view of the connection between the flexible printed circuit board and the fan module in this disclosure, and a schematic view depicting the combination of the fan circuit board and the fan frame in this disclosure. The fan module 60 includes a fan frame 61 and a fan connector 62 disposed on the outer surface of the fan frame 61. The fan frame 61 is used to accommodate components such as fan blades and motors. The fan connector 62 includes a wire-to-board connector or other suitable connectors. Additionally, the fan module 60 further includes a fan circuit board 63 fixed on the fan frame 61. The fan connector 62 is positioned and electrically connected to the fan circuit board 63.

In this embodiment, the fan module 60 and the input connector 40 are mounted at the front end of the chassis 10 away from the output connector 50. In this embodiment, the fan connector 62 is disposed on the outer surface of the fan frame 61 which is not adjacent to the chassis 10 (as shown in FIG. 1 to FIG. 3, disposed between the fan frame 61 and the input connector 40) to facilitate the assembly between the connecting component 70 and the fan connector 62. In another embodiment, the fan connector 62 is disposed on the outer surface of the fan frame 61 adjacent to the chassis 10 (for example, between the fan frame 61 and the bottom surface of the chassis 10) to simplify the routing of the connecting components 70. In other embodiments, the fan connector 62 may be disposed at a suitable position on the outer surface of the fan frame 61 based on different design considerations.

In this embodiment, the connecting component 70 is implemented in the form of a flexible printed circuit board, and includes a conducting section 71, a fan connecting section 72 and a lighting connecting section 73. One end of the conducting section 71 is electrically connected to the control board 20, and another end of the conducting section 71 is electrically connected to the fan connecting section 72 and the lighting connecting section 73. Additionally, one end of the fan connecting section 72 is electrically connected to the fan connector 62. The fan module 60 is electrically connected to the control board 20 through the fan connecting section 72 and the conducting section 71.

Accordingly, the control board 20 supplies the requisite power and/or other control functions essential for the operation of the fan module 60. In this embodiment, the lighting connecting section 73 is disposed corresponding to the light-guiding handle 80 and is adjacent to the chassis 10. The lighting component 82 is disposed on the lighting connecting section 73 and faces the light-guiding handle 80. The lighting component 82 is electrically connected to the control board 20 through the lighting connecting section 73 and the conducting section 71. Thus, the control board 20 provides the necessary power and/or other control functions required for illuminating the lighting component 82 and makes the lighting element 82 to emit light.

The light-guiding handle 80 is coupled to the chassis 10 for users to move the power supply device 1. In this embodiment, the light-guiding handle 80 may be made of a translucent material to transmit light emitted from the lighting component 82, and the light-guiding handle 80 is configured in a U shape.

Please refer to FIG. 3 and FIG. 4, which illustrate a schematic view of the connection between the flexible printed circuit board and the fan module in this disclosure and a schematic view of the combination of the fan circuit board and the fan frame in this disclosure. In this embodiment, a hollow slot 611 and an insertion slot 612 communicating with the hollow slot 611 are defined on the fan frame 61. Moreover, the fan circuit board 63 is inserted in the insertion slot 612, and that makes the fan connector 62 be exposed from the hollow slot 611.

Figure 5:
FIG. 5 illustrates another embodiment of the light-guiding handle in this disclosure.

Please further refer to FIG. 5, which illustrates another embodiment of the light-guiding handle in this disclosure. In the embodiment of FIG. 1, the light-guiding handle 80 is disposed on the right side in front of the chassis 10 and is not adjacent to the fan frame 61. However, in FIG. 5, the light-guiding handle 80 is mounted on the fan frame 61. In this embodiment, the light-guiding handle 80 may be made of a translucent material to transmit the light emitted from the lighting component 82. The light-guiding handle 80 is configured in a U shape and includes a gripping section 811 and a pair of supporting sections 812 connected to the gripping section 811. Two ends of the pair of supporting sections 812 are used to be fixed on the fan frame 61 (and/or the chassis 10).

Specifically, the light-guiding handle 80 is affixed to the lighting component 82. Light emitted from the lighting component 82 may pass through the light-guiding handle 80. As a result, users may easily discern the position of the light-guiding handle 80 in areas with inadequate lighting, so as to facilitate the user to apply force on the light-guiding handle 80 to move the power supply device 1.

Furthermore, a lighting hole 83 and a screw hole 84 are defined on the end surface of the supporting sections 812 of the light-guiding handle 80. The lighting hole 83 is arranged corresponding to the position of the lighting component 82. Additionally, the light-guiding handle 80 is secured to the fan frame 61 (and/or the chassis 10) utilizing multiple screws inserted through the screw holes 84.

Figure 6:
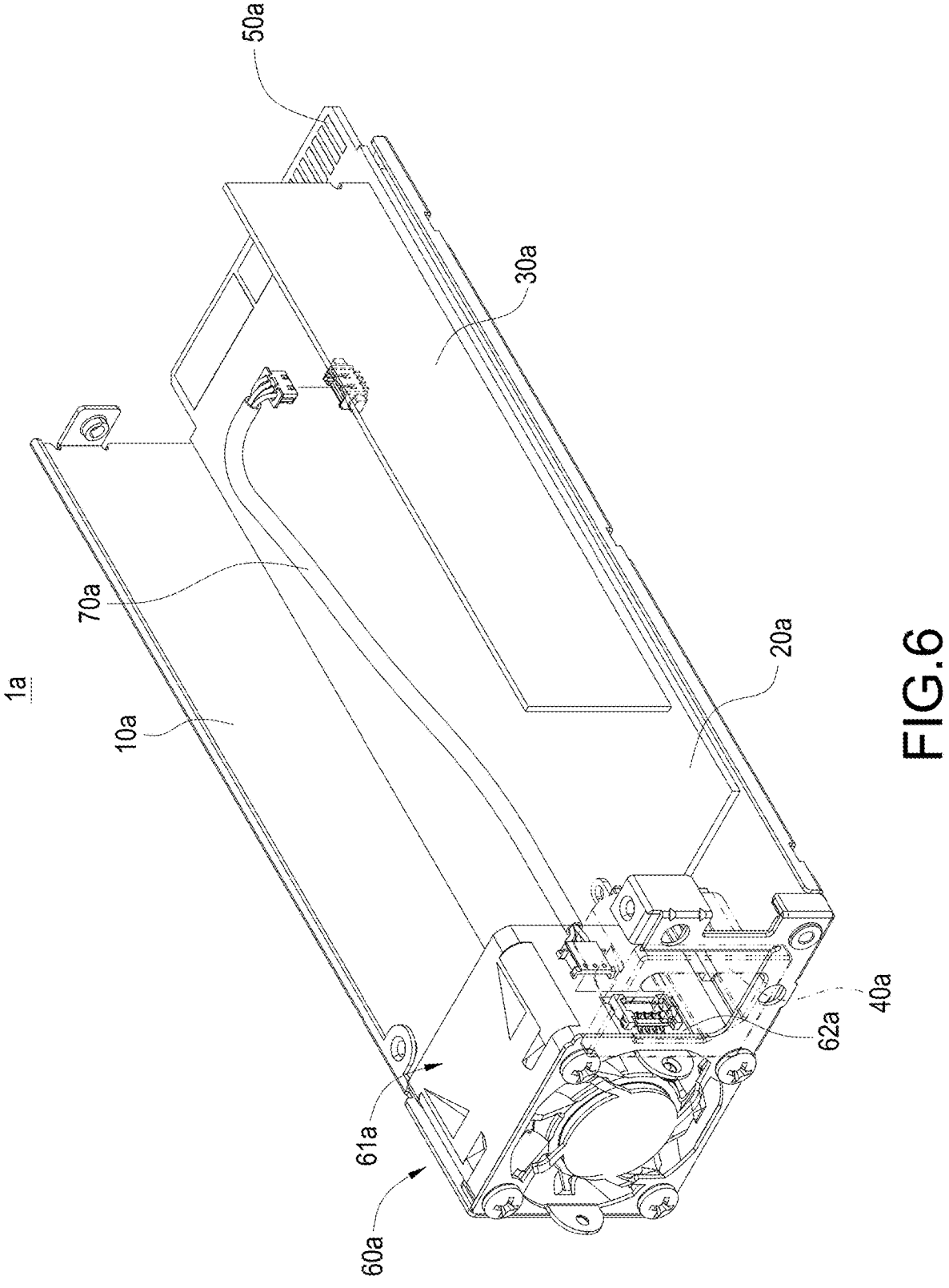
FIG. 6 and FIG. 7 illustrate schematic views of the application of another embodiment of the power supply device in this disclosure.
Figure 7:
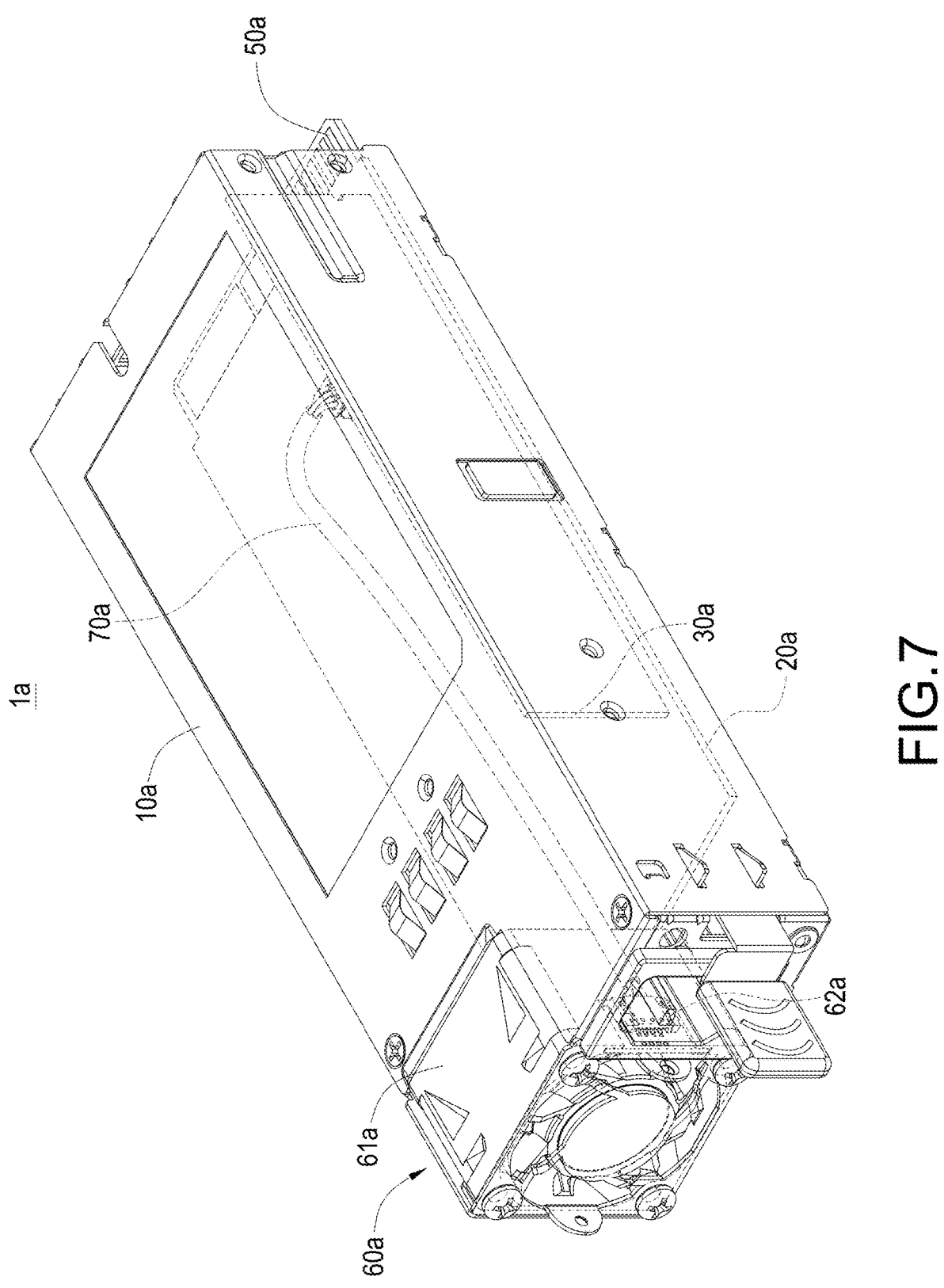

Please further refer to FIG. 6 and FIG. 7, which illustrate schematic views of the application of another embodiment of the power supply device in this disclosure. A power supply device 1a includes a chassis 10a, a control board 20a, an adapter board 30a, an input connector 40a, an output connector 50a and a fan module 60a. The fan module 60a is mounted within the chassis 10a and includes a fan frame 61a and a fan connector 62a disposed on the outer surface of the fan frame 61a. In this embodiment, the connecting component 70a is in the form of a conducting wire, and the fan connector 62a is electrically connected to the adapter board 30a via the connecting component 70a.

In summary, the fan module 60, 60*a* includes a fan connector 62, 62*a* exposed from the surface of the fan frames 61, 61*a*. Then, the fan module 60, 60*a* is electrically connected to the control board 20 or the adapter board 30*a* through one end of the connecting component 70, 70*a* (such as a flexible printed circuit board or a conducting wire) electrically connected to the fan connector 62, 62*a* and another end of the connecting component 70, 70*a* electrically connected to the control board 20 or the adapter board 30*a*. Therefore, the power supply device 1 in this disclosure does not require specific wire lengths or exit positions corresponding to the control board 20 or the adapter board 30*a* to simplify the connection structure of the fan modules 60, 60*a*. Additionally, when the connecting component is implemented in the form of a flexible printed circuit board, the flexible printed circuit board may be pressed between the control board 20 and the chassis 10 to prevent interference with other electronic components inside the chassis 1 and increase the convenience of installation.

While this disclosure has been described by means of specific embodiments, numerous modifications and variations could be made thereto by those skilled in the art without departing from the scope and spirit of this disclosure set forth in the claims.

What is claimed is:

1. A power supply device, comprising:
   a chassis;
   a control board, disposed in the chassis;
   an input connector, disposed in the chassis and electrically connected to the control board;
   an output connector, disposed in the chassis and electrically connected to the control board;
   a fan module, disposed in the chassis, comprising a fan frame and a fan connector disposed on an outer surface thereof;
   a flexible printed circuit board, comprising a conducting section, a fan connecting section and a lighting connecting section, one end of the conducting section electrically connected to the control board, another end of the conducting section electrically connected to the fan connecting section and the lighting connecting section, and the fan connecting section electrically connected to the fan connector;
   a light-guiding handle, coupled to the chassis; and
   a lighting component, disposed on the lighting connecting section and facing the light-guiding handle.

2. The power supply device according to claim 1, wherein a hollow slot is defined on the fan frame, and the fan connector is exposed from the hollow slot.

3. The power supply device according to claim 2, further comprising a fan circuit board, wherein an insertion slot is defined on the fan frame and communicates with the hollow slot, and the fan circuit board is inserted in the insertion slot.

4. The power supply device according to claim 1, wherein one end of the conducting section is sandwiched between the control board and the chassis.

5. The power supply device according to claim 1, wherein the light-guiding handle and the lighting component are mounted on the fan frame.

6. The power supply device according to claim 1, wherein the fan module and the input connector are mounted on a front end of the chassis away from the output connector, and the fan connector is disposed between the fan frame and the input connector.

* * * * *